US012761874B2

(12) United States Patent
Lee et al.

(10) Patent No.: US 12,761,874 B2
(45) Date of Patent: Oct. 13, 2026

(54) COMPUTE-IN-MEMORY SYSTEMS AND METHODS WITH CONFIGURABLE INPUT AND SUMMING UNITS

(71) Applicant: Taiwan Semiconductor Manufacturing Company, Ltd., Hsinchu (TW)

(72) Inventors: Chieh Lee, Hsinchu (TW); Chia-En Huang, Hsinchu County (TW); Yi-Ching Liu, Hsinchu City (TW); Wen-Chang Cheng, Richmond, TX (US); Yih Wang, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1115 days.

(21) Appl. No.: 17/686,147

(22) Filed: Mar. 3, 2022

(65) Prior Publication Data

US 2023/0022516 A1 Jan. 26, 2023

Related U.S. Application Data

(60) Provisional application No. 63/224,942, filed on Jul. 23, 2021.

(51) Int. Cl.

| | |
|---|---|
| ***G06F 7/544*** | (2006.01) |
| ***G06F 7/501*** | (2006.01) |
| ***G06N 3/04*** | (2023.01) |
| ***G11C 7/10*** | (2006.01) |

(52) U.S. Cl.
CPC ............ *G06F 7/5443* (2013.01); *G06F 7/501* (2013.01); *G06N 3/04* (2013.01); *G11C 7/1057* (2013.01); *G11C 7/1084* (2013.01)

(58) Field of Classification Search
CPC ................................ G06F 7/5443; G06N 3/04
See application file for complete search history.

(56) References Cited

U.S. PATENT DOCUMENTS

| | | | | |
|---|---|---|---|---|
| 11,216,716 | B2 | 1/2022 | Liu et al. | |
| 11,347,477 | B2 | 5/2022 | Sumbul et al. | |
| 11,423,979 | B2 | 8/2022 | Tran et al. | |
| 11,562,205 | B2 | 1/2023 | Wang et al. | |
| 11,853,890 | B2 | 12/2023 | Wang et al. | |
| 11,934,480 | B2 | 3/2024 | Lue et al. | |
| 2018/0046900 | A1* | 2/2018 | Dally | G06F 9/30018 |
| 2018/0157969 | A1 | 6/2018 | Xie et al. | |

(Continued)

FOREIGN PATENT DOCUMENTS

| | | | |
|---|---|---|---|
| CN | 112214198 | A | 1/2021 |
| CN | 112579043 | A | 3/2021 |

(Continued)

*Primary Examiner* — Michael D. Yaary
(74) *Attorney, Agent, or Firm* — Merchant & Gould P.C.

(57) ABSTRACT

A device includes a multiplication unit and a configurable summing unit. The multiplication unit is configured to receive data and weights for an Nth layer, where N is a positive integer. The multiplication unit is configured to multiply the data by the weights to provide multiplication results. The configurable summing unit is configured by Nth layer values to receive an Nth layer number of inputs and perform an Nth layer number of additions, and to sum the multiplication results and provide a configurable summing unit output.

20 Claims, 9 Drawing Sheets

(56) References Cited

U.S. PATENT DOCUMENTS

| | | | | |
|---|---|---|---|---|
| 2019/0138567 | A1* | 5/2019 | Martin | G06N 3/04 |
| 2020/0020393 | A1 | 1/2020 | Al-Shamma | |
| 2020/0285954 | A1 | 9/2020 | Li et al. | |
| 2021/0064379 | A1 | 3/2021 | Mattina et al. | |

FOREIGN PATENT DOCUMENTS

| | | | |
|---|---|---|---|
| TW | I696129 | B | 6/2020 |
| TW | 202024898 | A | 7/2020 |
| TW | I706337 | B | 10/2020 |
| TW | 202107304 | A | 2/2021 |
| TW | 202111703 | A | 3/2021 |
| TW | 202125286 | A | 7/2021 |

* cited by examiner

COMPUTE-IN-MEMORY SYSTEMS AND METHODS WITH CONFIGURABLE INPUT AND SUMMING UNITS

CROSS-REFERENCE TO RELATED APPLICATIONS

This application claims the benefit of U.S. Provisional Patent Application No. 63/224,942, filed on Jul. 23, 2021, the disclosure of which is incorporated by reference in its entirety.

BACKGROUND

Compute-in-memory (CIM) systems and methods store information in memory, such as random-access memory (RAM), of a memory device and perform calculations in the memory device, as opposed to moving data between the memory device and another device for various computational steps. In CIM systems and methods, the stored data is accessed more quickly from the memory device than from other storage devices. Also, the data is analyzed more quickly in the memory device, which enables faster reporting and decision-making in business and machine learning applications, such as convolutional neural networks (CNNs). CNNs, also referred to as ConvNets, are a class of artificial neural networks that specialize in processing data that has a grid-like topology, such as digital image data that includes binary representations of visual images. The digital image data includes pixels arranged in a grid-like topology, which contain values denoting image characteristics, such as color and brightness. CNNs are often used to analyze visual images in image recognition applications. Efforts are ongoing to improve the performance of CIM systems and CNNs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the disclosure and are not intended to be limiting.

DETAILED DESCRIPTION

Figure 1:
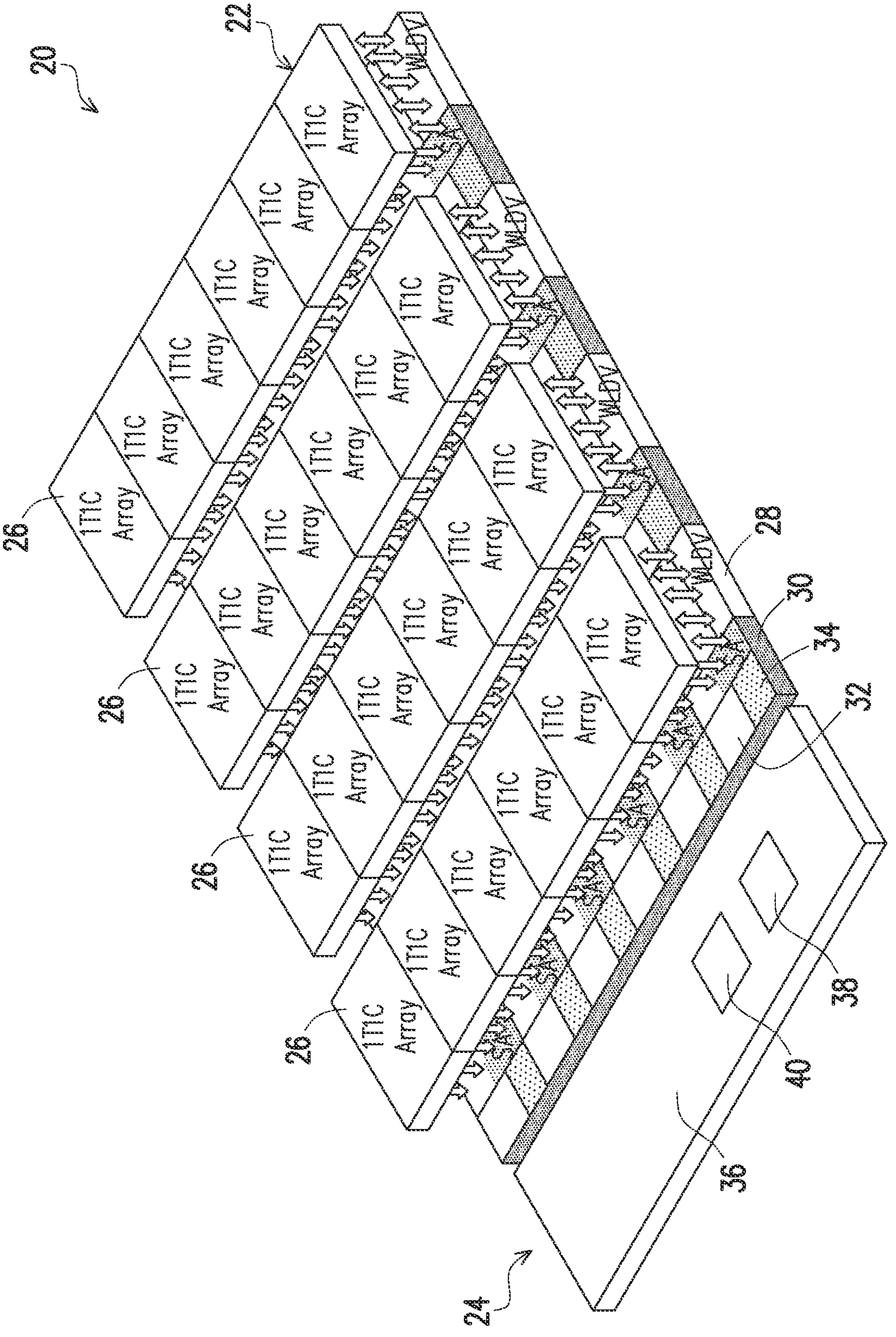
FIG. 1 is a diagram schematically illustrating a memory device that includes a memory array situated above or on top of memory device circuits, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

This disclosure relates to memory and more specifically to CIM systems and methods that include at least one programmable or configurable summing unit. The configurable summing unit can be programmed or set during operation of the CIM system to handle a different number of inputs, use a different number of sum units, such as adders in an adder tree, and, in some embodiments, to provide a different number of outputs. In some embodiments, the CIM systems and methods are for CNNs, such as for accelerating or improving the performance of the CNNs.

Typically, a CNN includes an input layer, an output layer, and a hidden layer that includes multiple convolution layers, pooling layers, fully connected layers, and normalization layers. Where convolution layers can include performing convolutions and/or performing cross-correlations. In CNN, the size of the input data is often different for different layers, such as for different convolution layers. Also, the number of weight values, filter/kernel values, and other operational numbers are often different for different convolution layers. As a result, the size of the sum unit, such as the number of adders in an adder tree, the number of inputs, and/or the number of outputs is often different for the different layers, such as for the different convolution layers. However, conventional CIM circuits have a fixed configuration based on the size of the memory array, such that they do not provide for adjusting the number of inputs and/or the number of adders in a sum unit.

Disclosed embodiments include memory circuits that include a memory array situated above or on top of one or more CIM logic circuits, i.e., the one or more CIM logic circuits are situated under the memory array. In some embodiments, the memory array coupled to the CIM logic circuits is one or more of a dynamic random-access memory (DRAM) array, a resistive random-access memory (RRAM) array, a magneto-resistive random-access memory (MRAM) array, and a phase-change random-access memory (PCRAM) array. In other embodiments, the memory array can be situated below or underneath the one or more CIM logic circuits.

Disclosed embodiments further include memory circuits that include at least one configurable summing unit that is programmable, such that it can be programmed or set during operation of the CIM system. In some embodiments, the at least one configurable summing unit is set during operation of the CIM system for each of the different convolution layers to accommodate, i.e., handle, a different number of inputs, use a different number of sum units, such as adders in an adder tree, and/or to provide a different number of outputs for the different convolution layers.

In some embodiments, the CIM system can do calculations for each of the different layers of a CNN, including for each of the different convolution layers, using the same configurable summing unit. In some embodiments, in a first layer of the CNN, a unit, such as a multiplication unit, interacts input data with weights, such as kernel/filter weights. The interacted results are output to a configurable summing unit that sums the interacted results and, in some embodiments, provides one or more of scaling the summed results and a non-linear activation function, such as a rectified non-linear unit (ReLU) function. Next, pooling is performed on the data from the configurable summing unit to reduce the size of the data and, after pooling, the output is fed back to the unit for interacting data with weights to do the next layer of the CNN. Once all computing for all the layers of the CNN is completed, a result is output. Embodiments of this disclosure can be used in multiple different technology generations, such as at multiple different technology nodes. Also, embodiments of the disclosure can be adapted to applications other than CNN.

Advantages of this architecture include having a configurable summing unit that can support a variable number of inputs, adders, and outputs. The configurable summing unit can be programmed or set for each of the different layers of a CNN, such as for each of the different convolutional layers, including settings for the number of inputs, the number of summations or adders, and the number of outputs, such that the calculations for each of the different layers, from the first layer to the last layer, can all be completed by one configurable summing unit in one memory device. Also, this architecture enables having higher memory capacities for CIM systems performing CNN functions, such as for accelerating or improving the performance of the CNN.

FIG. 1 is a diagram schematically illustrating a memory device 20 that includes a memory array 22 situated above or on top of memory device circuits 24, in accordance with some embodiments. In some embodiments, the memory device 20 is a CIM memory device that includes memory device circuits 24 configured to provide functions for applications, such as CNN applications. In some embodiments, the memory device 20 includes a memory array 22 that is a back-end-of-line (BEOL) memory array situated above memory device circuits 24 that are front-end-of-line (FEOL) circuits. In other embodiments, the memory array 22 can be situated on the same level or below/underneath the memory device circuits 24.

The memory array 22 is a DRAM memory array including multiple one transistor, one capacitor (1T-1C) DRAM memory arrays 26. In other embodiments, the memory array 22 can be a different type of memory array, such as an RRAM array, an MRAM array, and a PCRAM array. In still other embodiments, the memory array 22 can be a static random-access memory (SRAM) array.

The memory device circuits 24 include word line drivers (WLDVs) 28, sense amplifiers (SAs) 30, column select (CS) circuits 32, read circuits 34, and CIM circuits 36. The WLDVs 28 and the SAs 30 are situated directly under the DRAM memory arrays 26 and electrically coupled to the DRAM memory arrays 26. The CS circuits 32 and the read circuits 34 are situated between the footprints of the DRAM memory arrays 26 and electrically coupled to the SAs 30. Each of the read circuits 34 includes a read port electrically coupled to the CIM circuits 36 that are configured to receive data from the read ports.

The CIM circuits 36 include circuits that perform functions of supported applications, such as a CNN application. In some embodiments, the CIM circuits 36 include an analog-to-digital converter (ADC) circuit 38 and at least one programmable/configurable summing unit 40 that can be programmed or set during operation of the memory device 20 to handle a different number of inputs, use a different number of sum units, such as adders in an adder tree, and provide a different number of outputs. In some embodiments, the CIM circuits 36 perform functions of a CNN, such that the at least one configurable summing unit 40 is set during operation of the memory device for each of the different convolution layers in the CNN to handle a different number of inputs, use a different number of sum units, and/or provide a different number of outputs for the different convolution layers.

Figure 2:
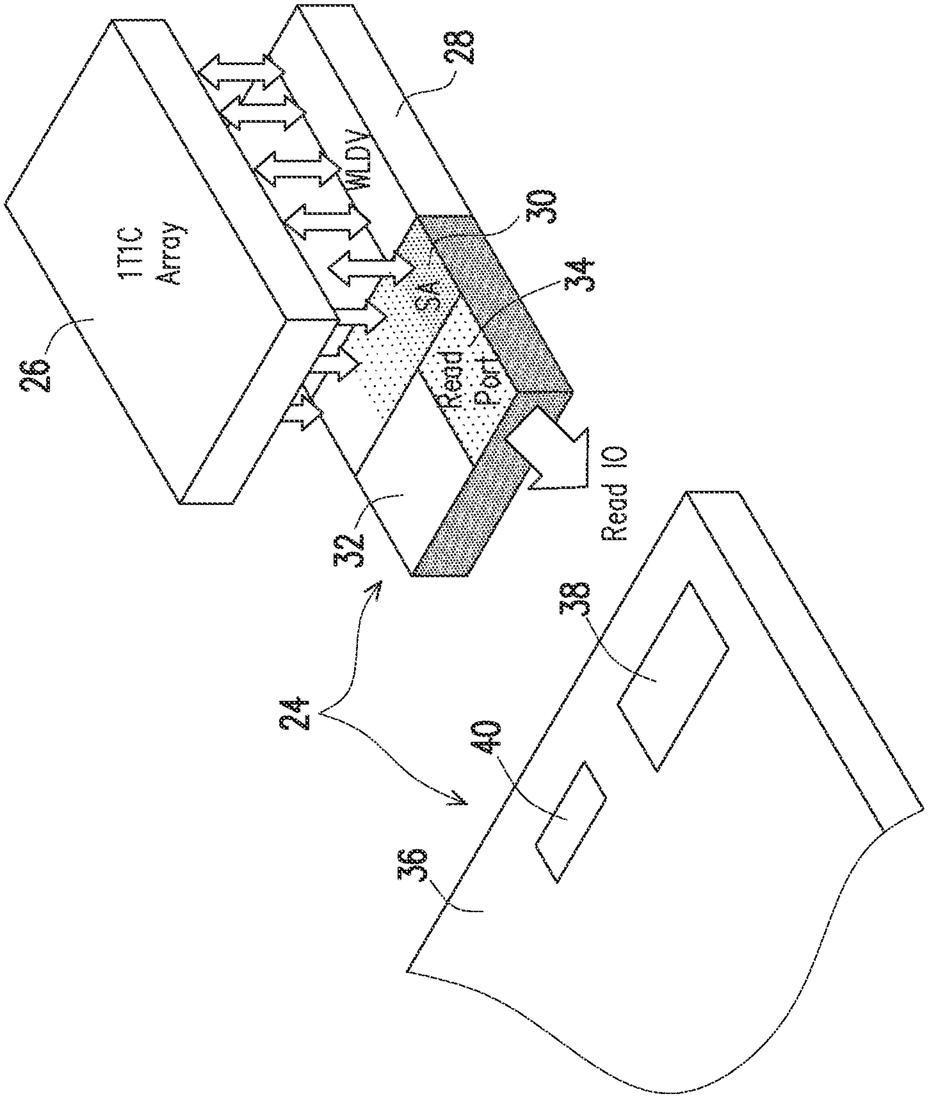
FIG. 2 is a diagram schematically illustrating a DRAM memory array electrically coupled to memory device circuits, in accordance with some embodiments.

FIG. 2 is a diagram schematically illustrating a DRAM memory array 26 electrically coupled to memory device circuits 24, in accordance with some embodiments. The memory device circuits 24 include a WLDV 28 and a SA 30 situated directly underneath and electrically coupled to the DRAM memory array 26. Also, the memory device circuits 24 include a CS circuit 32 and a read circuit 34 electrically coupled to the SA 30 and situated adjacent a footprint of the DRAM memory array 26. In addition, the memory device circuits 24 include the CIM circuits 36 that include the ADC circuit 38 and the at least one programmable or configurable summing unit 40.

During a read operation, the SA 30 senses voltages from memory cells in the DRAM memory array 26 and the read circuit 34 obtains voltages from the SA 30 that correspond to the voltages sensed from the memory cells in the DRAM memory array 26. The WLDV 28 and the CS circuit 32 provide signals for reading the DRAM memory array 26 and the read circuit 34 outputs voltages at the read port that correspond to the voltages read from the SA 30 by the read circuit 34. The CIM circuits 36 receive the output voltages from the read port and perform functions of the memory device 20, such as functions for a CNN. During a write operation, the WLDV 28 and the CS circuit 32 provide signals for writing the DRAM memory array 26, and the SA 30 receives data that is written into the DRAM memory array 26. In some embodiments, the read circuit 34 is part of the SA 30. In some embodiments, the read circuit 34 is a separate circuit that is electrically connected to the SA 30.

The read circuit 34 provides output voltages through the read port that correspond to the voltages read from the SA 30 and the DRAM memory array 26. In some embodiments, the read port provides output voltages directly to the ADC circuit 38 and the ADC circuit 38 provides output voltages to other circuits in the CIM circuits 36. In some embodiments, the read port provides output voltages directly to other circuits in the CIM circuits 36, i.e., circuits other than the ADC circuit 38.

Figure 3:
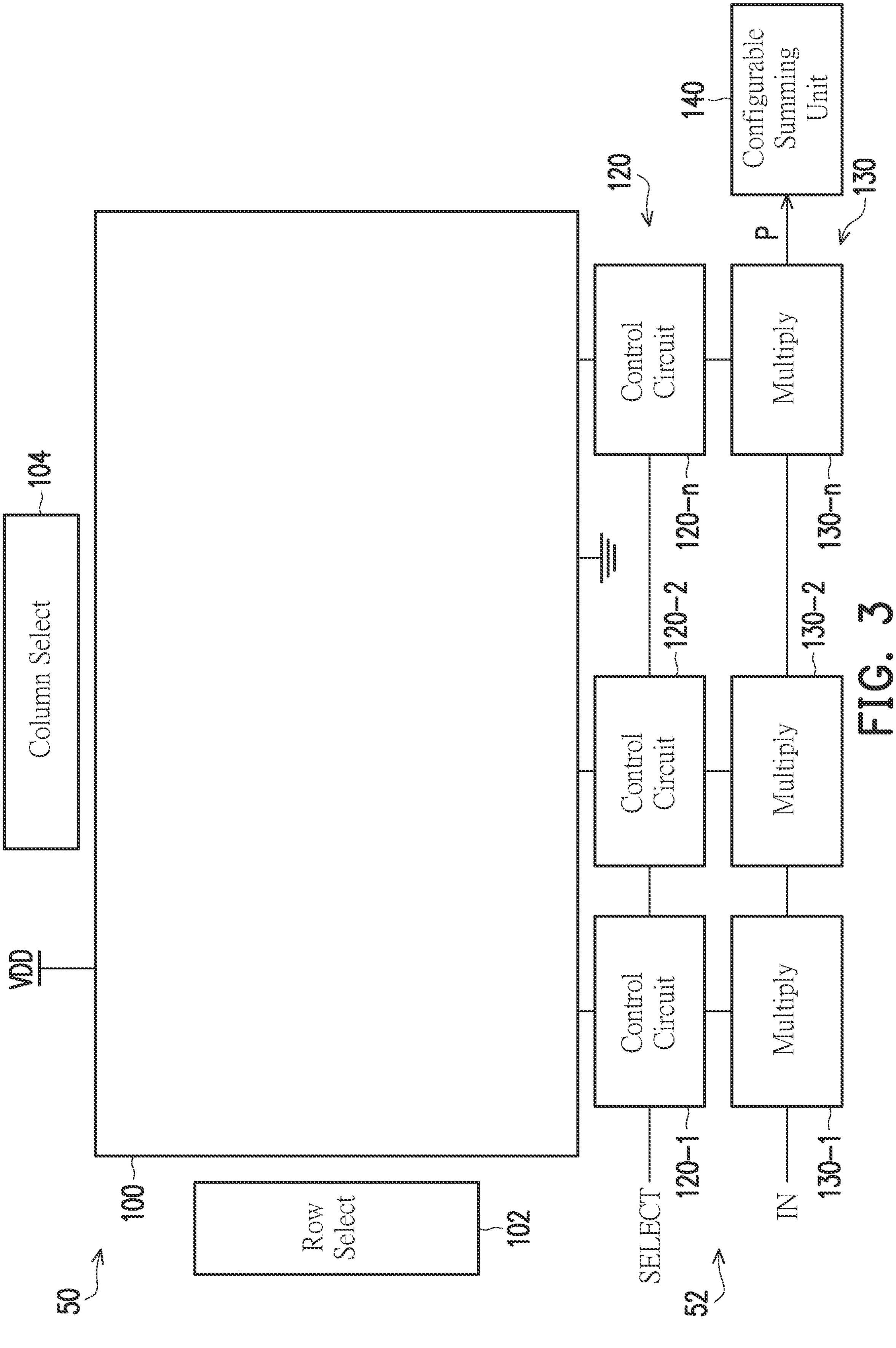
FIG. 3 is a diagram schematically illustrating an example of a CIM memory device that includes CIM circuits electrically coupled to a memory array in the CIM memory device, in accordance with some embodiments.

FIG. 3 is a diagram schematically illustrating an example of a CIM memory device 50 that includes CIM circuits 52 electrically coupled to a memory array 100 in the CIM memory device 50, in accordance with some embodiments. In some embodiments, the CIM memory device 50 is like the memory device 20 of FIG. 1. In some embodiments, the CIM circuits 52 are configured to provide functions for applications, such as a CNN application. In some embodiments, the memory array 100 is a BEOL memory array situated above the CIM circuits 52 that are FEOL circuits.

In this example, the memory array 100 includes a plurality of memory cells that store CNN weights. The memory array 100 and the associated circuits are connected between a power terminal configured to receive a VDD voltage and a ground terminal. A row select circuit 102 and a column select circuit 104 are connected to the memory array 100 and configured to select memory cells in rows and columns of the memory array 100 during read and write operations.

The memory array 100 includes a control circuit 120 connected to bit lines of the memory array 100 and configured to select memory cells in response to a select signal SELECT. The control circuit 120 includes control circuits 120-1, 120-2 . . . **120-*n* connected to the memory array 100**.

The CIM circuits 52 include a multiplication unit or circuit 130 and a configurable summing unit or circuit 140. An input terminal is configured to receive an input signal IN, and the multiplication circuit 130 is configured to multiply selected weights stored in the memory array 100 by the input signal IN to generate a plurality of partial products P. The multiplication circuit 130 includes multiply circuits 130-1, 130-2 . . . **130-*n*. The partial products P are output to the configurable summing unit 140** that is configured to add the partial products P to produce a summation output.

Figure 4:
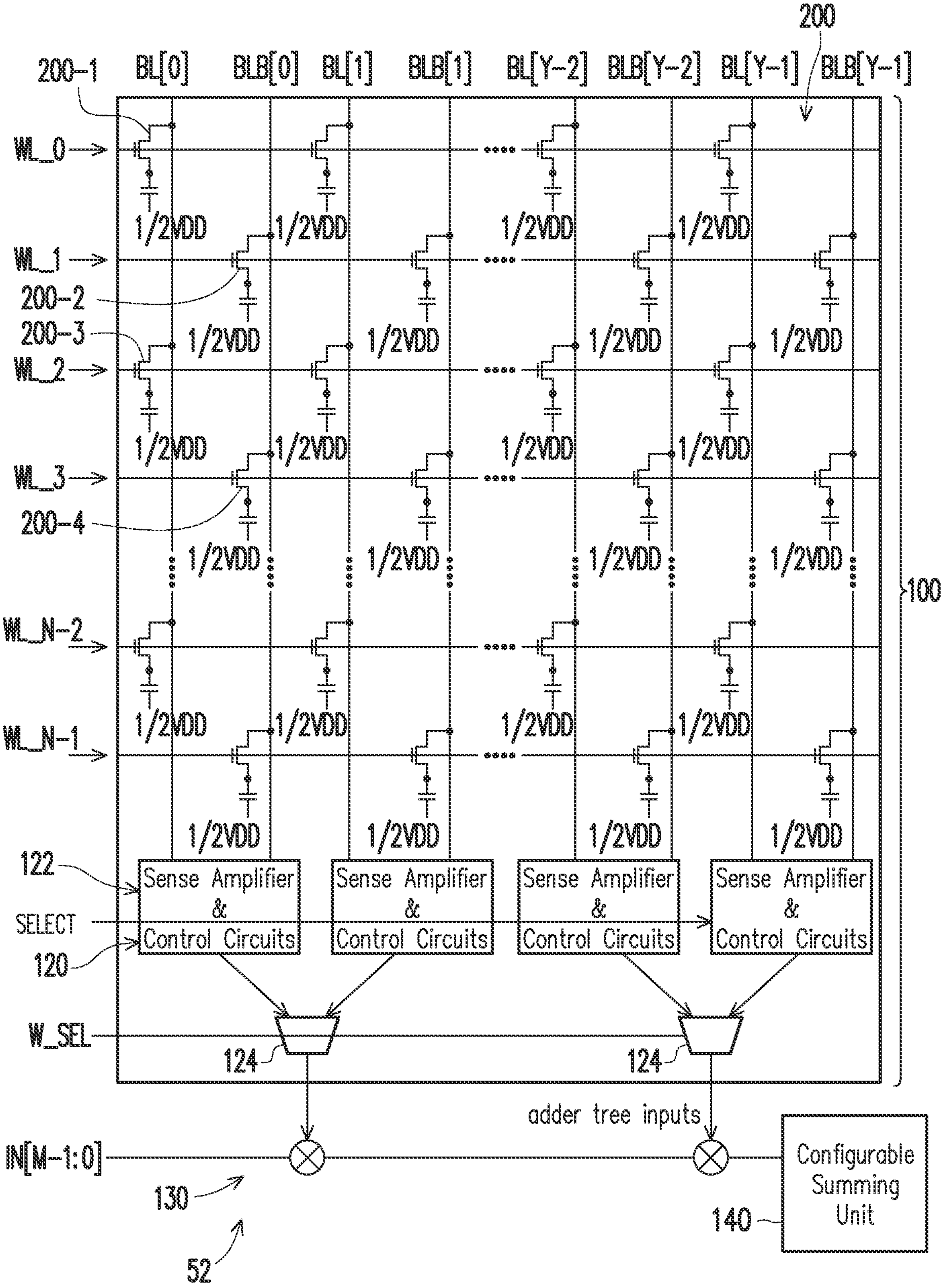
FIG. 4 is a diagram schematically illustrating the memory array and corresponding CIM circuits, in accordance with some embodiments.

FIG. 4 is a diagram schematically illustrating the memory array 100 and corresponding CIM circuits 52, in accordance with some embodiments. The memory array 100 includes a plurality of memory cells 200, including memory cells 200-1, 200-2, 200-3, and 200-4, arranged in rows and columns. The memory array 100 has N rows, where each row of the N rows has a corresponding word line WL, designated as one of the word lines WL_0 through WL_N-1. Each of the plurality of memory cells 200 is coupled to the word line WL of its row. Also, each column of the array 100 has a bit line BL and a bit line bar (inverted bit line) BLB. In this example, the memory array 100 has Y columns, such that the bit lines are designated as bit lines BL[0] through BL[Y−1] and BLB[0] through BLB[Y−1]. Each of the plurality of memory cells 200 is coupled to one of the bit lines BL or one of the bit line bars BLB in its column.

SAs 122 and control circuits 120 are connected to the bit lines BL and the bit line bars BLB, and multiplexers (MUXs) 124 are connected to the outputs of the SAs 122 and the control circuits 120. In response to a weight select signal W_SEL, the MUXs 124 provide selected weights, retrieved from the memory array 100, to the multiply circuits 130.

Each of the memory cells 200 in the memory array 100 stores a high voltage, a low voltage, or a reference voltage. The memory cells 200 in the memory array 100 are 1T-1C memory cells in which a voltage is stored on a capacitor. In other embodiments, the memory cells 200 can be another type of memory cell.

Figure 5:
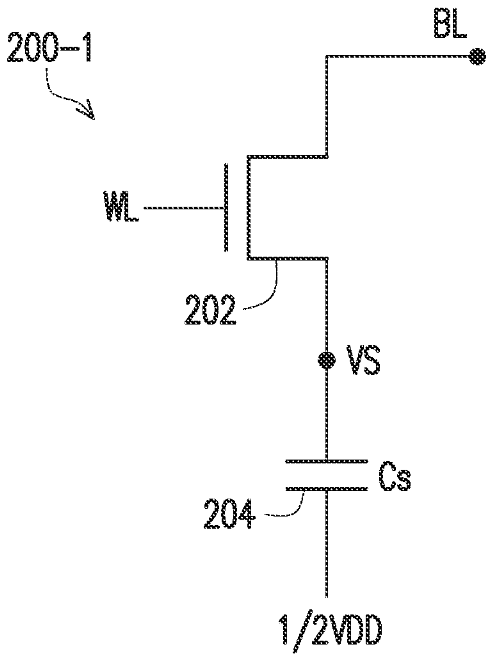
FIG. 5 is a diagram schematically illustrating a memory cell of the 1T-1C memory cells of the memory array, in accordance with some embodiments.

FIG. 5 is a diagram schematically illustrating the memory cell 200-1 of the 1T-1C memory cells 200 of the memory array 100, in accordance with some embodiments. The memory cell 200-1 has one transistor, such as a metal-oxide semiconductor field-effect transistor (mosfet) 202 and one storage capacitor 204. The transistor 202 operates as a switch interposed between the storage capacitor 204 and the bit line BL of the memory cell 200-1. A first drain/source terminal of the transistor 202 is connected to the bit line BL and a second drain/source terminal of the transistor 202 is connected to a first terminal of the capacitor 204. A second terminal of the capacitor 204 is connected to a voltage terminal that receives a reference voltage, such as ½VDD. The memory cell 200-1 stores a bit of information as electric charge on the capacitor 204. The gate of the transistor 202 is connected to one of the word lines WL for accessing the memory cell 200-1. In some embodiments VDD is 1.0 volt (V). In other embodiments, the second terminal of the capacitor 204 is connected to a voltage terminal that receives a reference voltage, such as ground.

In reference to FIG. 4, each of the word lines WL is connected to multiple memory cells of the plurality of memory cells 200, with each row of the memory array 100 having a corresponding WL. Also, each column of the memory array 100 includes a bit line BL and a bit line bar BLB. The first column of the memory array 100 includes BL[0] and BLB[0], the second column of the memory array 100 includes BL[1] and BLB[1], and so on, through the Yth column that includes BL[Y−1] and BLB[Y−1]. Each bit line BL and bit line bar BLB is connected to every other memory cell 200 in a column. Thus, the memory cell 200-1, shown in the leftmost column of the memory array 100, is connected to the bit line BL[0], the memory cell 200-2 is connected to the bit line bar BLB[0], the memory cell 200-3 is connected to the bit line BL[0], and the memory cell 200-4 is connected to the bit line bar BLB[0], and so on.

Each column of the memory array 100 has a SA 122 connected to the bit line BL and the bit line bar BLB of that column. The SAs 122 include a pair of cross-connected inverters between the bit line BL and the bit line bar BLB, with a first inverter having an input connected to the bit line BL and an output connected to the bit line bar BLB, and the second inverter having an input connected to the bit line bar BLB and an output connected to the bit line BL. This results in a positive feedback loop that stabilizes with one of the bit line BL and the bit line bar BLB at a high voltage and the other one of the bit line BL and the bit line bar BLB at a low voltage.

In a read operation, word lines and bit lines are selected based on an address received by the row select circuit 102 and the column select circuit 104. Bit lines BL and bit line bars BLB in the memory array 100 are pre-charged to a voltage between a high voltage, such as VDD, and a low voltage, such as ground. In some embodiments, the bit lines BL and the bit line bars BLB are pre-charged to ½ VDD.

Further, word lines WL for selected rows are driven to access the information stored in selected memory cells 200. If the transistors in the memory array 100 are NMOS transistors, the word lines are driven to a high voltage to turn on the transistors and connect the storage capacitors to the corresponding bit lines BL and bit line bars BLB. If the transistors in the memory array 100 are PMOS transistors, the word lines are driven to a low voltage to turn on the transistors and connect the storage capacitors to the corresponding bit lines BL and bit line bars BLB.

Connecting a storage capacitor to a bit line BL or to a bit line bar BLB, changes the charge/voltage on that bit line BL or bit line bar BLB from the pre-charged voltage level to a higher or lower voltage. This new voltage is compared to another voltage by one of the SAs 122 to determine the information stored in the memory cell 200.

In some embodiments, to sense this new voltage, one of the control circuits 120 selects a SA 122 in response to the SELECT signal and voltages from the bit line BL and the bit line bar BLB (or a reference memory cell) are provided to the SA 122. The SA 122 compares these voltages and a read circuit, such as one of the read circuits 34, provides an output signal to an ADC circuit, such as the ADC circuit 38. The ADC circuit 38 provides an ADC output to one of the MUXs 124 that provides a MUX output to one of the multiply circuits 130, where the input signal IN is combined with the weight signals. The multiply circuit 130 further provides partial products P to the configurable summing unit 140 that is configured to add the partial products P to produce a configurable summing unit output.

In a write operation, word lines and bit lines are selected based on an address received by the row select circuit 102 and the column select circuit 104. To write a memory cell, such as memory cell 200-1, the word line WL_0 is driven high to access the storage capacitor 204 and a high or low voltage is written into the memory cell 200-1 by driving the bit line BL[0] to the high or low voltage level, which charges or discharges the storage capacitor 204 to the selected voltage level.

In some embodiments, the memory device 20 of FIG. 1 and the CIM memory device 50 of FIG. 3 are used to perform CNN functions. As noted above, a CNN includes multiple layers, such as an input layer, a hidden layer, and an output layer, where the hidden layer can include multiple convolution layers, pooling layers, fully connected layers, and scaling or normalization layers.

Figure 6:
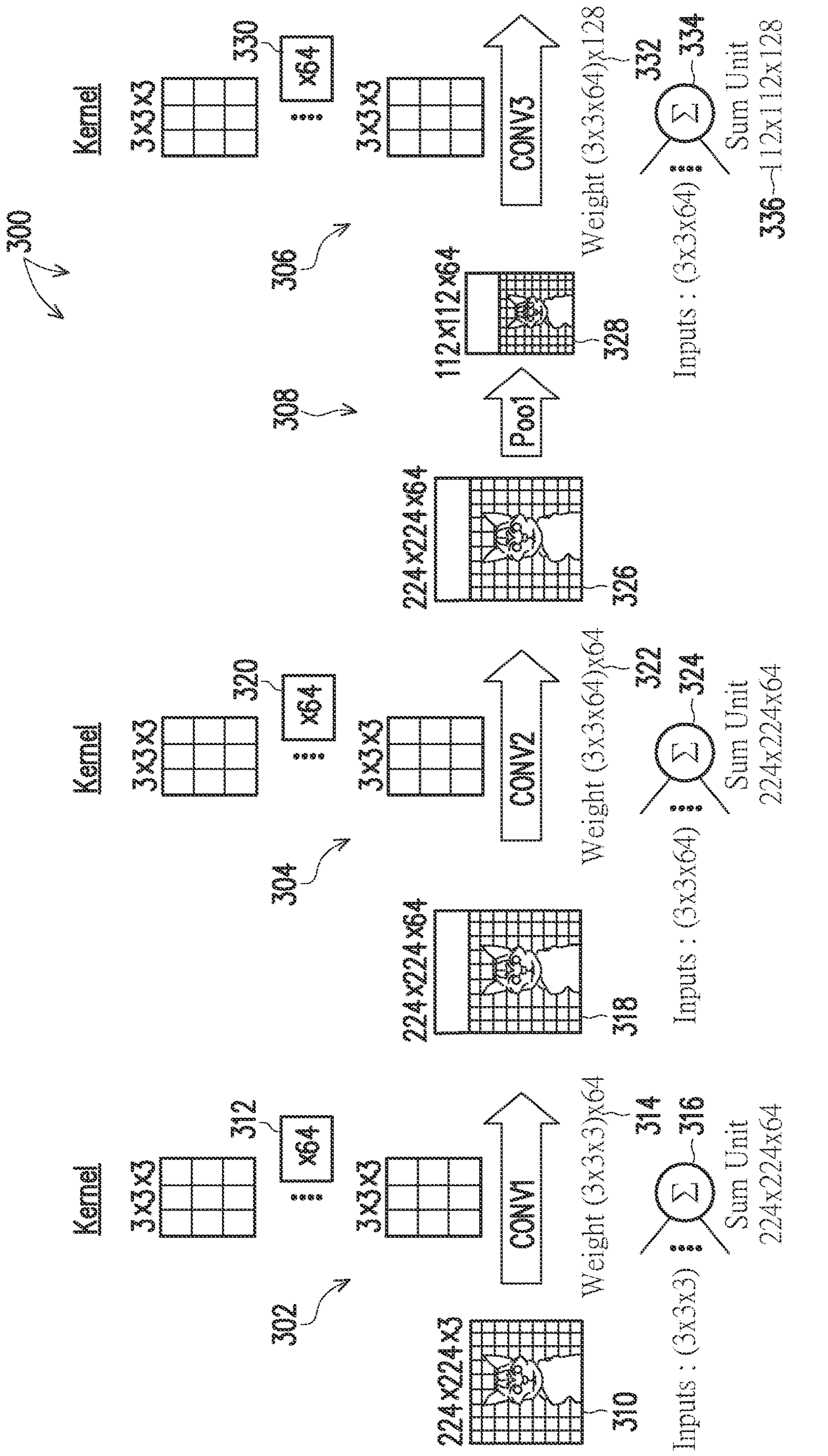
FIG. 6 is a diagram schematically illustrating at least part of a CNN, in accordance with some embodiments.

FIG. 6 is a diagram schematically illustrating at least part of a CNN 300, in accordance with some embodiments. The CNN 300 includes three convolutions 302, 304, and 306 and a pooling function 308. In some embodiments, the CNN 300 includes more convolutions and/or more pooling functions. In some embodiments, the CNN 300 includes other functions, such as scaling/normalization functions and/or non-linear activation functions, such as a ReLU function.

The first convolution 302 receives an input image 310 that is 224×224×3 units, such as pixels. Also, the first convolution 302 includes 64 kernels/filters 312 that are each 3×3×3 units, for a total of (3×3×3)×64 weights 314. The inputs to the sum unit 316 are the 3×3×3 convolution calculations over the 224×224×3 input image 310 with the 64 kernels/filters 312, which results in an output image 318 that is 224×224×64 units.

The second convolution 304 receives the output image 318 that is 224×224×64 units. Also, the second convolution 304 includes 64 kernels/filters 320 that are each 3×3×3, for a total of (3×3×64)×64 weights 322. The inputs to the sum unit 324 are the 3×3×64 convolution calculations over the 224×224×64 image 318 with the 64 kernels/filters 320, resulting in an output image 326 that is 224×224×64 units.

The pooling function 308 is configured to receive the output image 326 that is 224×224×64 and produce a reduced size output image 328 that is 112×112×64 units.

The third convolution 306 receives the reduced size output image 328 that is 112×112×64 units, and the third convolution 306 includes 128 kernels/filters 330 that are each 3×3×3, for a total of (3×3×64)×128 weights 332. The inputs to the sum unit 334 are the 3×3×64 convolution calculations over the 112×112×64 image 320 with the 128 kernels/filters 330, resulting in an output image 336 that is 112×112×128 units. In some embodiments, this continues for more convolutions and/or more pooling functions.

Thus, in a CNN the size of the input image data, the size and number of the kernels/filters, the number of weights, and the size of the output image data varies from one convolution layer to the next. As a result, the size and number of sum units, such as the number of inputs, the number of adders in an adder tree, and the number of outputs, is often different for different convolution layers.

In CNN 300, the size of the input data to the sum units 316, 324, and 334 varies from 3×3×3 units to 3×3×64 units and the size of the resulting outputs 318, 326, and 336 varies from 224×224×64 units to 112×112×128 units. Thus, the size of the input data, the size and number of sum units or adders, and the size of the outputs are different for different convolution layers.

Figure 7:
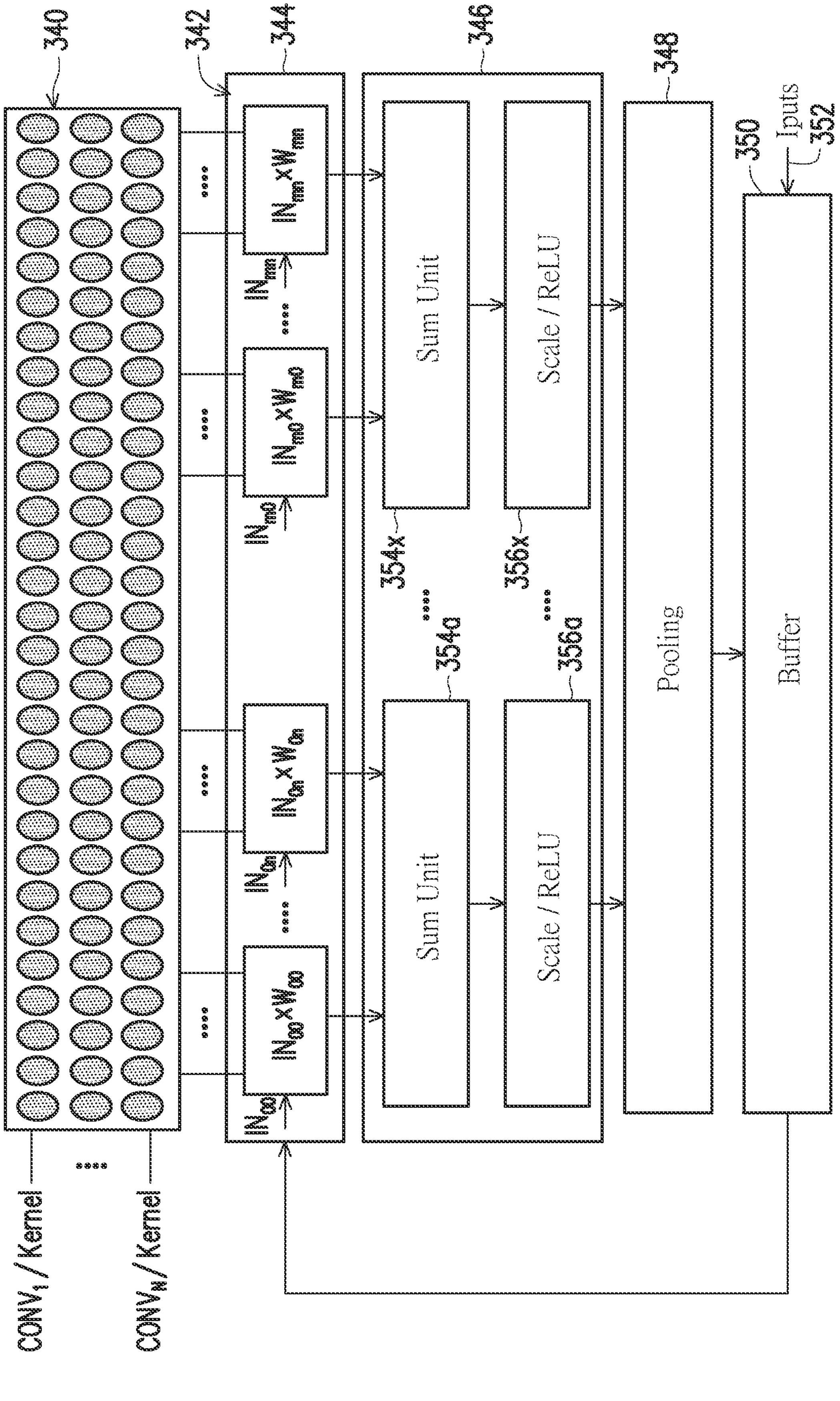
FIG. 7 is a diagram schematically illustrating a memory array and a CIM circuit that can be configured to determine outputs for different convolution layers in a CNN, in accordance with some embodiments.

FIG. 7 is a diagram schematically illustrating a memory array 340 and CIM circuits 342 that can be programmed or configured to determine outputs for different convolution layers in a CNN, such as the CNN 300 of FIG. 6, in accordance with some embodiments. In some embodiments, the CIM circuits 342 are like the CIM circuits 36 (shown in FIG. 1). In some embodiments, the CIM circuits 342 are like the CIM circuits 52 (shown in FIG. 3).

The CIM circuits 342 include a multiplication unit 344, a configurable summing unit 346, a pooling unit 348, and a buffer 350. The memory array 340 is electrically coupled to the multiplication unit 344 that is electrically coupled to the configurable summing unit 346 and the buffer 350. Also, the configurable summing unit 346 is electrically coupled to the pooling unit 348 that is electrically coupled to the buffer 350.

The memory array 340 stores the kernel/filters for each convolution layer 1–N of the CNN, such as kernel/filters 312, 320, and 330 of CNN 300. Thus, the memory array 340 stores the weights of the CNN. The memory array 340 is situated above or on top of the CIM circuits 342, i.e., the CIM circuits 342 are situated under the memory array 340. In some embodiments, the memory array 340 is like the memory array 22 (shown in FIG. 1). In some embodiments, the memory array 340 is like one of the memory arrays 26 (shown in FIG. 1). In some embodiments, the memory array 340 is like the memory array 100 (shown in FIG. 3). In some embodiments, the memory array 340 is one or more of a DRAM array, an RRAM array, an MRAM array, and a PCRAM array. In other embodiments, the memory array 340 is situated level with or below/underneath the CIM circuits 342.

The buffer 350 is configured to receive input data, such as initial image data, from a data input 352 and processed input data from the pooling unit 348. The multiplication unit 344 receives the input data from the buffer 350 and weights from the memory array 340. The multiplication unit 344 interacts the input data with the weights to produce interacted results that are provided to the configurable summing unit 346. In some embodiments, the multiplication unit 344 receives input data from the buffer 350 and the weights from the memory array 340 and performs convolutional multiplications on the input data and the weights to produce the interacted results. In some embodiments, the input data are organized into a data matrix IN00 to INmn and the weights are organized into a weight matrix W00 to Wmn. In some embodiments, the multiplication unit 344 is like the multiplication unit 130.

The configurable summing unit 346 includes sum units 354*a*-354*x* and scale/ReLU units 356*a*-356*x*. The configurable summing unit 346 is programmed by each convolution layer 1-N, such as by a pattern of 0's and 1's, to configure the configurable summing unit 346 to handle a selected number of inputs, provide a selected number of summations, and provide a selected number of outputs for the convolution layer 1-N. The configurable summing unit 346 receives the interacted results from the multiplication unit 344 and sums the interacted results with the selected number of sum units 354*a*-354*x* to provide sum results. In some embodiments, in the CNN 300, the configurable summing unit 346 is configured by each convolution layer 302, 304, and 306 to perform the summing of each of the sum units 316, 324, and 334 (shown in FIG. 6). In some embodiments, the configurable summing unit 346 is like the configurable summing unit 40. In some embodiments, the configurable summing unit 346 is like the configurable summing unit 140.

The sum units 354*a*-354*x* provide sum results to the scale/ReLU units 356*a*-356*x*. In some embodiments, the scale/ReLU units 356*a*-356*x* receive the sum results and scale the sum results, such as normalize the sum results, to provide scaled results. In some embodiments, the scale/ReLU units 356*a*-356*x* receive the sum results and perform the ReLU function on the sum results. In some embodiments, the scale/ReLU units 356*a*-356*x* perform the ReLU function on scaled results. In other embodiments, the scale/ReLU units 356*a*-356*x* perform another non-linear activation function on the sum results or the scaled results.

The configurable summing unit 346 provides a configurable summing unit result to the pooling unit 348, which performs a pooling function on the configurable summing unit result to reduce the size of the output data and provide a pooled output. In some embodiments, the pooling unit 348 is configured to perform the pooling function 308 (shown in FIG. 6).

After pooling, the pooled output is received by the buffer 350 and fed back to the multiplication unit 344 to interact the data with the weights for the next convolution layer 1-N of the CNN, such as CNN 300. Once all computing for all the layers of the CNN is completed, a result is output from the buffer 350.

Advantages of the CIM circuits 342 include having a configurable summing unit 346 that supports multiple different convolution layers 1-N. The configurable summing unit 346 can be programmed or set for each of the different convolution layers 1-N of the CNN, such as for each of the different convolution layers of CNN 300, including set for the number of inputs, the number of summations or adders, and the number of outputs, such that the calculations for each of the different convolution layers 1-N, from the first layer to the last layer, can all be completed by the one configurable summing unit 346.

Figure 8:
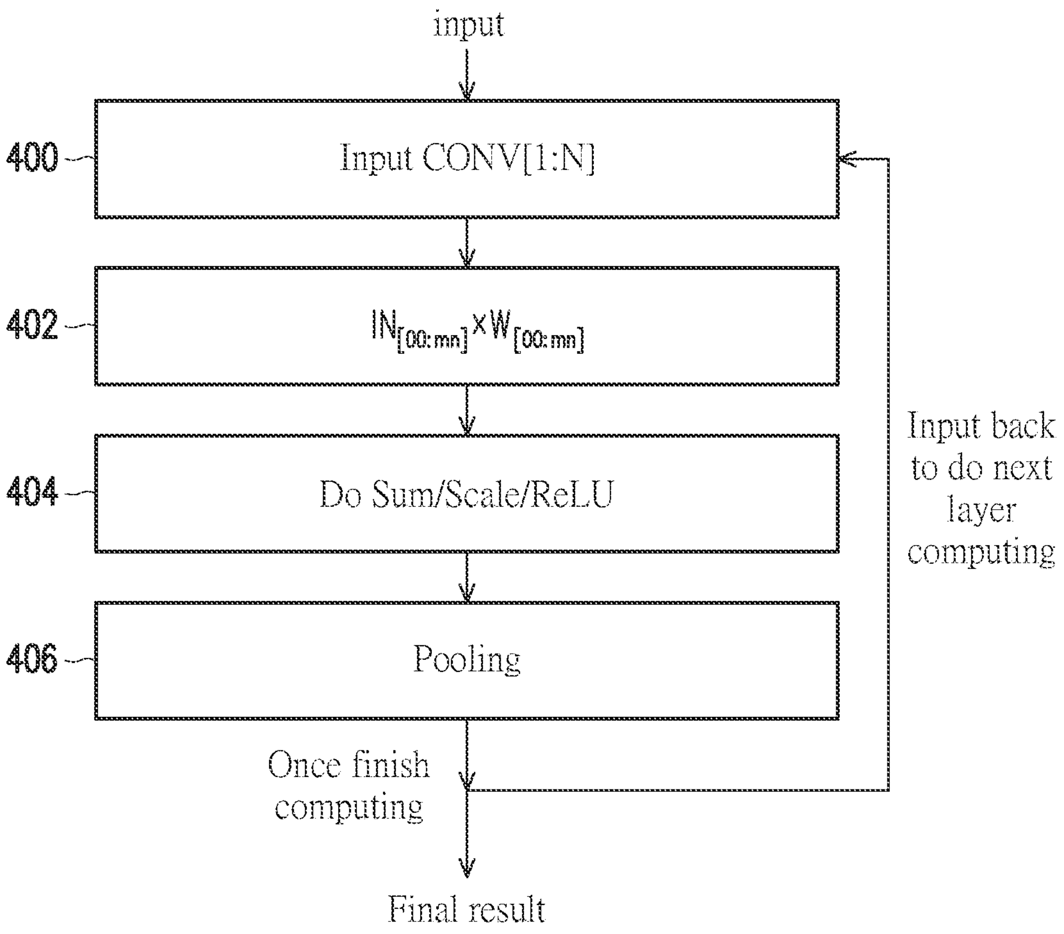
FIG. 8 is a diagram schematically illustrating operational flow of the CIM circuit of FIG. 7, in accordance with some embodiments.

FIG. 8 is a diagram schematically illustrating operational flow of the CIM circuits 342, in accordance with some embodiments. The CIM circuits 342 include the configurable summing unit 346 such that calculations for different convolution layers of a CNN can be completed using the same circuit. The configurable summing unit 346 is programmed or set for one of the convolution layers 1-N by values provided by the convolution layer, such as by a pattern of 0's and 1's, to set the number of inputs, the number of summations, and the number of outputs, for the convolution layer. This can be done for each of the convolution layers in a CNN.

At 400, input data such as initial image data for a first convolution layer or input data that is output data from a previous convolution layer and for a subsequent convolution layer is received by the buffer 350. At 402, the input data from the buffer 350 and weights from the memory array 340 for one of the convolution layers 1-N are received by the multiplication unit 344 that interacts the input data with the weights to obtain an interacted result. In some embodiments, the multiplication unit 344 provides convolutional multiplication of the input data with the weights to provide the interacted result.

At 404, the configurable summing unit 346 receives values from the convolution layer data for setting the number of inputs, the number of summations or adders, and the number of outputs for the current convolution layer. The configurable summing unit 346 is set for the current convolution layer and the configurable summing unit 346 receives the interacted results from the multiplication unit 344. The configurable summing unit 346 performs one or more of summing the interacted results to provide sum results, scaling the sum results to provide scaled results, and performing a non-linear activation function, such as ReLU, on the sum results or on the scaled results to provide configurable summing unit results.

At 406, the pooling unit 348 receives the configurable summing unit results and performs a pooling function on the configurable summing unit results to reduce the size of the output data and provide a pooled output. After pooling, if all the layers of the CNN are not completed, the pooled output is provided to the buffer 350 at 400 and the multiplication unit 344 at 402 to interact the pooled output data with the weights for the next convolution layer 1-N of the CNN. After pooling, if all computing for all the layers of the CNN is completed, a result is provided from the buffer 350. In some embodiments, only some of the steps of this method are performed during a pass through the method. In some embodiments, pooling at 406 is optional.

Figure 9:
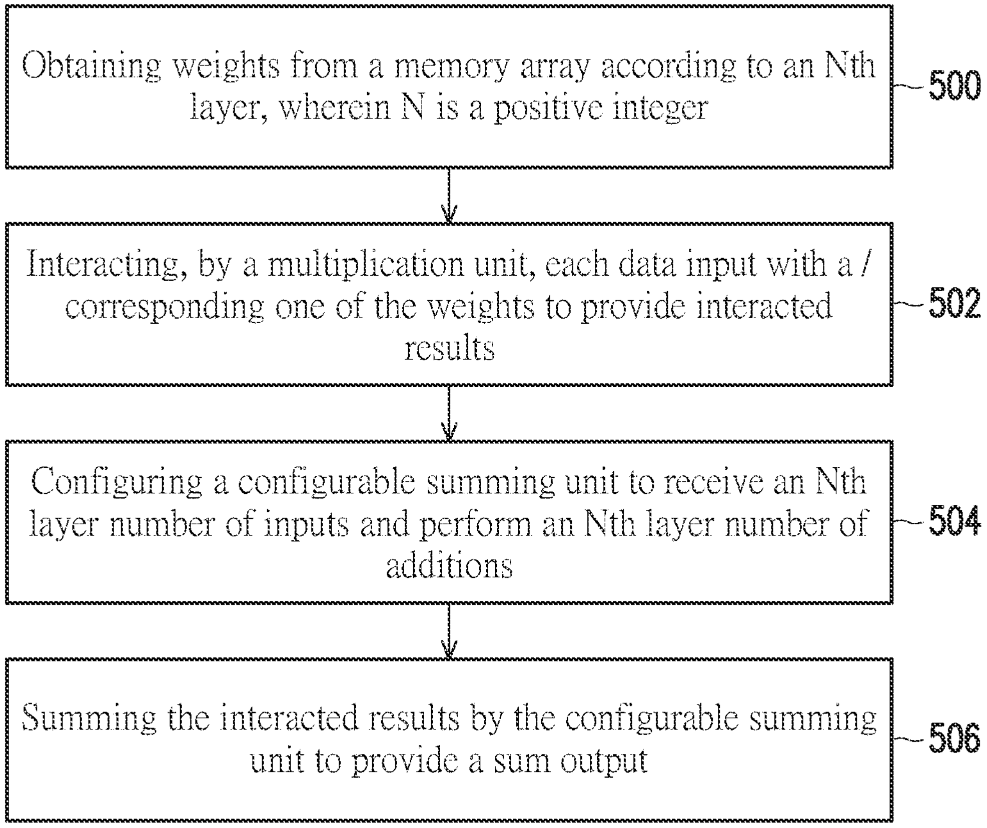
FIG. 9 is a diagram schematically illustrating a method of determining sum results for convolution layers in a CNN, in accordance with some embodiments.

FIG. 9 is a diagram schematically illustrating a method of determining sum results for convolution layers in a CNN, in accordance with some embodiments. At 500, the method includes obtaining weights from a memory array, such as memory array 340, according to an Nth layer, wherein N is a positive integer. At 502, the method includes interacting, by a multiplication unit, such as multiplication unit 344, each data input with a corresponding one of the weights to provide interacted results. In some embodiments, the multiplication unit 344 provides convolutional multiplication of the input data with the weights to provide the interacted results.

At 504, the method includes configuring a configurable summing unit, such as configurable summing unit 346, to receive an Nth layer number of inputs and perform an Nth layer number of additions. In some embodiments, the configurable summing unit 346 is programmed for one of the convolution layers 1-N by values provided by the convolution layer, such as by a pattern of 0's and 1's, to set one or more of the number of inputs, the number of summations, and the number of outputs, for the convolution layer.

At 506, the method includes summing the interacted results by the configurable summing unit to provide a sum result, also referred to herein as a sum output. In some embodiments, the method includes at least one of scaling the sum output to provide a scaled result, also referred to herein as a scaled output, and filtering one of the sum output and the scaled output with a non-linear activation function to provide a configurable summing unit result/output. In some embodiments, filtering one of the sum output and the scaled output with a non-linear activation function includes filtering one of the sum output and the scaled output with a ReLU function.

In some embodiments, the method further includes one or more of pooling the configurable summing unit result to provide a pooled result, feeding the pooled result back to the multiplication unit to perform the next Nth layer of computing, and outputting a final result after all N layers have been completed.

Disclosed embodiments thus provide CIM systems and methods that include at least one programmable or configurable summing unit that can be programmed during operation of the CIM system to handle a different number of inputs, use a different number of sum units, such as adders in an adder tree, and provide a different number of outputs. In some embodiments, the at least one configurable summing unit is set during operation of the CIM system for each convolution layer in a CNN.

In some embodiments, in a first layer of a CNN, a multiplication unit interacts input data with weights to provide interacted results. The configurable summing unit receives and sums the interacted results and provides one or more of scaling the summed results and a non-linear activation function, such as a ReLU function. Next, at least optionally, pooling is performed on the data from the configurable summing unit to reduce the size of the data. After pooling, if all layers are not completed, the output is fed back to the multiplication unit for interacting the data with weights for the next layer of the CNN. Once all computing for all the layers of the CNN is completed, a result is output.

Advantages of this architecture include having a configurable summing unit that can be programmed for each of the different layers of a CNN, such that the calculations for each of the different layers, from the first layer to the last layer, can all be completed by one configurable summing unit in one memory device.

Disclosed embodiments further include a memory array situated above or on top of the CIM circuits. Where this architecture enables higher memory capacities for CIM systems performing CNN functions, such as for accelerating or improving the performance of the CNN.

In accordance with some embodiments, a device includes a multiplication unit and a configurable summing unit. The multiplication unit is configured to receive data and weights for an Nth layer, where N is a positive integer. The multiplication unit is configured to multiply the data by the weights to provide multiplication results. The configurable summing unit is configured by Nth layer values to receive an Nth layer number of inputs and perform an Nth layer number of additions, and to sum the multiplication results and provide a configurable summing unit output.

In accordance with further embodiments, a memory device includes a memory array including memory cells and compute-in-memory circuits situated in the memory device and electrically coupled to the memory array. The compute-in-memory circuits include a multiplication unit, a configurable summing unit, a pooling unit, and a buffer. The multiplication unit receives weights from the memory array for an Nth layer, where N is a positive integer, and data inputs. The multiplication unit interacts each data input with a corresponding one of the weights to provide interacted results. The configurable summing unit is configured by the Nth layer to sum the interacted results and provide a summed result. The pooling unit pools the summed result and the buffer feeds the pooled result back to the multiplication unit to compute a next one of the Nth layers, where the buffer outputs a result after all N layers have been completed.

In accordance with still further disclosed aspects, a method includes: obtaining weights from a memory array according to an Nth layer, wherein N is a positive integer; interacting, by a multiplication unit, each data input with a corresponding one of the weights to provide interacted results; configuring a configurable summing unit to receive an Nth layer number of inputs and perform an Nth layer number of additions; and summing the interacted results by the configurable summing unit to provide a sum output.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:

a memory array that includes control circuits connected to bit lines of the memory array and multiplexers connected to the control circuits; and compute-in-memory circuits that are situated under the memory array and electrically coupled to the memory array, the compute-in-memory circuits include:

a multiplication circuit that has an input terminal and includes multiple multiply circuits that receive data through the input terminal and that receive weights from the memory array through the multiple for N convolution layers, where N is a positive integer, the multiple multiply circuits multiply the data by the weights to provide multiplication results; and a programmable summing circuit that is programmed by a pattern of 1's and 0's that corresponds to a convolution layer of the N convolution layers to set a number of inputs, a number of adders, and a number of outputs for the convolution layer during operation of the compute-in-memory circuits, wherein each of the N convolution lavers has a corresponding pattern of 1's and 0's to set the configured Haver number of inputs, the number of adders, and the number of outputs for that convolution layer, the programmable summing circuit sums the multiplication results and provides a programmable summing circuit output.

2. The device of claim 1, wherein the programmable summing circuit includes at least two adders that sum the multiplication results and provide a sum output.

3. The device of claim 2, wherein the programmable summing circuit includes a scaling unit that scales the sum output and provides a scaled output.

4. The device of claim 3, wherein the programmable summing circuit includes a non-linear activation function unit configured to filter one of the sum output and the scaled output to provide the programmable summing circuit output.

5. The device of claim 4, wherein the non-linear activation function unit includes a rectified non-linear unit (ReLU).

6. The device of claim 1, wherein the compute-in-memory circuits include a pooling unit configured to pool the programmable summing circuit output and provide a pooled result.

7. The device of claim 6, wherein the co te-in-memory circuits include a buffer that receives input data and the pooled result and provides one of the input data and the pooled result back to the multiplication circuit to compute a next one of the N convolution layers, wherein the buffer outputs a result after all N convolution layers have been completed.

8. The device of claim 1, wherein the memory array is a dynamic random access memory array that stores the weights.

9. A memory device, comprising:

a memory array that includes memory cells, control circuits connected to bit lines of the memory cells, and multiplexers connected to the control circuits; and compute-in-memory circuits situated under the memory array and in the memory device and electrically coupled to the memory array, the compute-in-memory circuits including:

a multiplication circuit that has an input terminal and includes multiple multiply circuits that receive data through the input terminal and that receive weights from the memory array through the multiplexers for N convolution layers, where N is a positive integer, the multiple multiply circuits interact the data with the weights to provide interacted results;

a programmable summing circuit that is programmed by a data pattern that corresponds to a convolution layer of the N convolution layers to set a number of inputs, a number of adders, and a number of outputs for the convolution layer during operation of the compute-in-memory circuits, wherein each of the N convolution lavers has a corresponding data pattern to set the number of inputs, the number of adders, and the number of outputs for that convolution layer, the programmable summing circuit sums the interacted results and provides summed result;

a pooling unit that pools a programmable summing circuit result that is based on the summed result and provides a pooled result; and a buffer that feeds the pooled result back to the multiplication circuit to compute a next one of the N convolution layers, wherein the buffer outputs a result after all N convolution layers have been completed.

10. The memory device of claim 9, wherein the programmable summing circuit includes a scaling unit that scales the summed result and provides a scaled output.

11. The memory device of claim 10, wherein the rogrammable summing circuit includes a non-linear activation function circuit that filters one of the summed result and the scaled output to provide the programmable summing circuit result.

12. The memory device of claim 9, wherein the programmable summing circuit includes multiple adders.

13. The memory device of claim 9, wherein the programmable summing circuit includes multiple adders in an adder tree.

14. The memory device of claim 9, wherein the N convolution layers are convolution layers in a convolutional neural network.

15. The memory device of claim 14, wherein the convolution layers include performing cross-correlations.

16. A method, comprising:

reading weights from a memory array through multiplexers electrically coupled to bit lines of memory cells in the memory array, the weights for N convolution layers, wherein N is a positive integer;

multiplying by compute-in-memory circuits that are situated under the memory array and electrically coupled to the memory array, the compute-in-memory circuits including a multiplication circuit that has an input terminal and includes multiple multiply circuits that receive data through the input terminal and that receive the weights from the memory array through the multiplexers, the multiple multiply circuits multiplying the data with the weights to provide interacted results;

programming a programmable summing circuit that is part of the compute-in-memory circuits with a data pattern that corresponds to a convolution layer of the N convolution layers to set a number of inputs, a number of adders, and a number of outputs for the convolution layer during operation of the computer-in-memory circuits, wherein each of the N convolution layers has a corresponding data pattern that sets the number of inputs, the number of adders, and the number of outputs for that convolution layer; and adding the interacted results by the programmabl summing circuit to provide a sum output.

17. The method of claim 16, comprising at least one of:

scaling the sum output to provide a scaled output; and filtering one of the sum output and the scaled output with a non-linear activation function to provide a programmable summing circuit output.

18. The method of claim 17, wherein filtering one of the sum output and the scaled output with a non-linear activation function includes filtering one of the sum output and the scaled output with a rectified non-linear unit (ReLU) function.

19. The method of claim 17, comprising pooling the programmable summing circuit output to provide a pooled result.

20. The method of claim 19, comprising:

feeding the pooled result back to the multiplication circuit to perform calculations for the next layer of the N convolution layers; and outputting a result after all N convolution layers have been completed.

* * * * *